US005515022A

United States Patent [19]

Tashiro et al.

[11] Patent Number: 5,515,022

[45] Date of Patent: May 7, 1996

[54] MULTILAYERED INDUCTOR

[75] Inventors: Kouji Tashiro; Akira Kaneko, both of Chiba, Japan

[73] Assignee: TDK Corporation, Tokyo, Japan

[21] Appl. No.: 285,766

[22] Filed: Aug. 3, 1994

Related U.S. Application Data

[63] Continuation of Ser. No. 882,539, May 13, 1992, abandoned.

[30] Foreign Application Priority Data

May 13, 1991 [JP] Japan .................................... 3-137127

[51] Int. Cl.[6] ................................ H01F 5/00; H05K 1/14

[52] U.S. Cl. .......................... 336/200; 336/232; 174/262

[58] Field of Search .................................... 336/200, 232; 174/262

[56] References Cited

U.S. PATENT DOCUMENTS

| | | | |
|---|---|---|---|
| 3,765,082 | 10/1973 | Zyetz | 29/602 |
| 3,812,443 | 5/1974 | Muckelroy | 336/83 |
| 4,371,744 | 2/1983 | Badet et al. | 174/262 X |
| 4,598,276 | 7/1986 | Tait | 336/200 |
| 4,626,816 | 12/1986 | Bhemkin et al. | 336/200 X |
| 4,959,631 | 9/1990 | Hasegawa et al. | 336/83 |
| 5,237,132 | 8/1993 | Takahashi | 174/262 |

FOREIGN PATENT DOCUMENTS

| | | | |
|---|---|---|---|
| 57-78609 | 5/1982 | Japan . | |
| 60-50331 | 11/1985 | Japan . | |
| 62-25858 | 7/1987 | Japan . | |
| 102215 | 5/1988 | Japan | 336/200 |
| 1-151211 | 6/1989 | Japan . | |
| 2126610 | 5/1990 | Japan | 336/200 |

*Primary Examiner*—Kristine L. Kincaid
*Assistant Examiner*—Laura Thomas
*Attorney, Agent, or Firm*—Oblon, Spivak, McClelland, Maier, & Neustadt

[57] ABSTRACT

A multilayer inductor 1 is fabricated, for example, by sandwiching a first magnetic material sheet (21) between a second magnetic material sheet (22) and a third magnetic material sheet (23) and integrating the three layers. The first magnetic material sheet (21) is preferably at least 0.2 mm thick and has a first spiral conductor pattern (31) having an extreme lead-out portion (310) formed on its upper major surface. The first sheet (21) is provided with a through-hole (4) extending between the opposed major surfaces and having a larger diameter on the conductor pattern bearing surface. The through-hole (4) is filled with a conductor (35) contiguous to the first conductor pattern (31). The second magnetic material sheet (22) has a second spiral conductor pattern (32) having an extreme lead-out portion (320) formed on its upper major surface and connected to the conductor (35) in the through-hole (4). The magnetic material sheets (21, 22) on their major surfaces having the first and second conductor patterns (31, 32) formed thereon are provided with dummy conductor patterns (61, 65) which are spaced from and opposed to the extreme lead-out portions (310, 320), respectively, and external electrodes are connected. Benefits include easy fabrication, safe connection, least property variation, improved manufacturing yield and reliability.

14 Claims, 6 Drawing Sheets

MULTILAYERED INDUCTOR

This application is a Continuation of application Ser. No. 07/882,539, filed on May 13, 1992, now abandoned.

FIELD OF THE INVENTION

This invention relates to a multilayer inductor.

BACKGROUND OF THE INVENTION

Bead cores based on magnetic material such as ferrite and amorphous magnetic alloys are used as noise suppressors in various electronic circuits for noise suppression purposes. Prior art bead cores include various types, for example, toroidal beads of small-size magnetic material, wired forming type, and axial and radial taping types. These bead cores are directly attached to leads of electronic parts or electrically connected to circuits. In accordance with the size reduction of electronic equipment and the widespread use of equipment to which bead cores are applied, there are acutely increasing needs to reduce the size of bead cores and to provide bead cores in tape form adapted for automatic packaging like conventional parts and in leadless form adapted for surface mounting.

On the other hand, surface mountable multilayer inductors for use as ordinary coils and composite LC parts have been commercially used. Such multilayer inductors are fabricated by alternately stacking magnetic material layers and conductor layers in accordance with thick film techniques, followed by firing.

Coreless and open magnetic circuit type inductors having conductor coil patterns formed on insulating substrates as disclosed in Japanese U.M. Publication No. 25858/1987 and Japanese U.M. Application Kokai No. 78609/1982 are not suitable for such applications because of low impedance whereas multilayer inductors of the closed magnetic circuit type having magnetic material layers can be used as noise suppressing bead cores or noise suppressors.

Although it is desirable to use multilayer inductors as noise suppressing bead cores, elements of reduced size have a lower impedance and the impedance at the service frequency, for example, in the high-frequency range of about 50 to 1000 MHz is insufficient. If the number of laminae or number of turns is increased in order to increase impedance, there results disadvantages including a lower resonance frequency, exacerbated high-frequency response, an increased number of manufacturing steps, an increased cost, and inefficient large-scale manufacture.

The prior art multilayer inductors are generally classified into printed multilayer type and green sheet multilayer type. The printed multilayer type is fabricated, as described in Japanese Patent Publication No. 50331/1985, for example, by printing a conductor pattern of less than 1 turn, printing a magnetic material so that the conductor pattern is partially exposed, and repeating these printing steps, followed by firing.

However, it was found that the printed multilayer type could not use a magnetic material layer of thicker than 0.1 mm because conductor connection becomes uncertain and the impedance at a high frequency of higher than 400 MHz was very low. Even if the number of turns was increased in order to increase impedance, the resonance frequency shifted toward a low frequency side and as a consequence, the high-frequency impedance was low.

On the other hand, the green sheet multilayer type is fabricated, as described in Japanese Patent Application Kokai No. 151211/1989, for example, by forming a conductor pattern on a green magnetic material sheet having a throughhole, and stacking a plurality of such sheets, followed by firing. In this case, a plurality of green sheets are formed with conductor patterns having a predetermined number of turns (less than 1 turn) and stacked such that the conductor patterns are connected through the conductor fillings in the through-holes in the sheets, completing a coil having a predetermined number of turns as a whole. The green sheets at the leading and trailing ends of the coil are provided along opposite edges with extreme lead-out portions of strip shape connected to the coil ends. A pair of external electrodes are connected to the extreme lead-out portions exposed at the opposite edges.

The multilayer inductors for bead cores are required of size reduction to a thickness of about 0.8 to 1.5 mm. In order to achieve a desired impedance with such a size, it is advantageous for large-scale manufacture to reduce the number of layers by forming a spiral coil section on a green sheet such that the number of turns per green sheet is increased to more than 1 turn and increasing the thickness of the green sheet.

In this case, magnetic material sheets used have a thickness of at least 0.2 mm at the end of firing which is greater than in the prior art. Then, a multilayer inductor is fabricated by printing a conductive paste on green sheets in a pattern having a strip-shaped extreme lead-out portion throughout the edge, stacking and compression bonding the printed sheets, firing, and applying an external electrode-forming paste to the opposed edges, followed by firing to form external electrodes. Since the green sheets are too thick to provide wettability with the external electrode-forming paste, insufficient connection can occur between the lead-out portions and the external electrode, leading to the risk of an increase, variation or change with time of DC resistance and even of poor conduction.

In the fabrication of multilayer inductors, it is preferred in view of large-scale production to form an array of many printed patterns of conductive paste each corresponding to the conductor pattern 31 of one layer on a green sheet having a large area, stacking and compression bonding a plurality of such printed sheets, and then cutting the laminate into chips, followed by firing. If the stacking and cutting are done in misalignment, there is increased the possibility of poor conduction as a result of insufficient connection between the external electrodes and the extreme lead-out portions. Misalignment between the patterns resulting from stacking misalignment can also lead to a misalignment between the conductor in the through-hole and the conductor pattern on the underlying green sheet, which also causes losses of manufacturing yield and reliability.

SUMMARY OF THE INVENTION

A primary object of the present invention is to provide a multilayer inductor which is characterized by minimized performance variation, high manufacturing yield and high reliability.

This and other objects are accomplished by the present invention which are defined below from (1) to (13).

(1) A multilayer inductor wherein a plurality of magnetic material sheets including at least a first magnetic material sheet and a second magnetic material sheet are integrally stacked, said first magnetic material sheet has a first conductor pattern having an extreme lead-out portion formed on one major surface thereof, said first magnetic material sheet is provided with a through-hole extending between the opposed major surfaces thereof where the first conductor pattern is formed, said through-hole is filled with a conductor contiguous to said first conductor pattern, said second magnetic material sheet has a second conductor pattern having an extreme lead-out portion formed on that major surface facing said first magnetic material sheet, said second conductor pattern is connected to the conductor filling said through-hole either directly or indirectly, said first and second magnetic material sheets on their major surfaces having the first and second conductor patterns formed thereon, respectively, are provided with dummy conductor patterns which are spaced from the first and second conductor patterns and disposed in substantial registry with the extreme lead-out portions of the second and first conductor patterns, respectively, and a pair of external electrodes are connected to the extreme lead-out portions of said first and second conductor patterns.

(2) The multilayer inductor of (1) wherein said through-hole has a diameter $r_0$ on the major surface having the first conductor pattern formed thereon and a diameter $r_1$ on the opposed major surface, $r_0$ being larger than $r_1$.

(3) The multilayer inductor of (2) wherein $r_0/r_1$ =1.2 to 1.7.

(4) The multilayer inductor of (1) wherein said first magnetic material sheet has a thickness of at least 0.2 mm.

(5) The multilayer inductor of (4) which has a thickness of 0.5 to 2 mm and includes three magnetic material sheets of approximately equal thickness.

(6) The multilayer inductor of (5) wherein the conductor pattern consists of the first and second conductor patterns and provides at least about ¾ turns in total.

(7) The multilayer inductor of (2) wherein said first and second conductor patterns include pads at the connections of said conductor patterns to the conductor filled in said through-hole, the pads being wider than the pattern width of said first and second conductor patterns.

(8) The multilayer inductor of any one of (1) to (7) which is fabricated by the steps of:

furnishing first, second and third green magnetic material sheets, perforating a plurality of through-holes in the first green magnetic material sheet at a predetermined spacing and printing a conductor paste on the sheet to form a plurality of first conductor patterns at a predetermined spacing and to fill the through-holes with a conductor, printing a conductor paste on the second green magnetic material sheet to form a plurality of second conductor patterns at a predetermined spacing, stacking and compression bonding the first, second and third green magnetic material sheets, and processing the stack into chips, thereafter firing the chips and finally forming external electrodes on the chips.

(9) A multilayer inductor comprising a plurality of integrally stacked magnetic material sheets, wherein said magnetic material sheets include at least one first magnetic material sheet, said first magnetic material sheet has a thickness of at least 0.2 mm and a conductor pattern formed on one major surface thereof, said first magnetic material sheet is provided with a through-hole extending between the opposed major surfaces thereof where the conductor pattern is formed, said through-hole has a diameter $r_0$ on the major surface having the conductor pattern formed thereon which is larger than the through-hole diameter on the opposed major surface, said through-hole is filled with a conductor contiguous to said conductor pattern.

(10) The multilayer inductor of (9) wherein $r_0/r_1$= 1.2 to 1.7.

(11) The multilayer inductor of (4) which has a thickness of 0.5 to 2 mm and includes three magnetic material sheets of approximately equal thickness.

(12) The multilayer inductor of (11) wherein the conductor pattern consists of first and second conductor patterns and provides at least about ¾ turns in total.

(13) The multilayer inductor of (9) wherein said first and second conductor patterns includes pads at the connections of said conductor patterns to the conductor filled in said through-hole, the pads being wider than the pattern width of said first and second conductor patterns.

Figure 1:
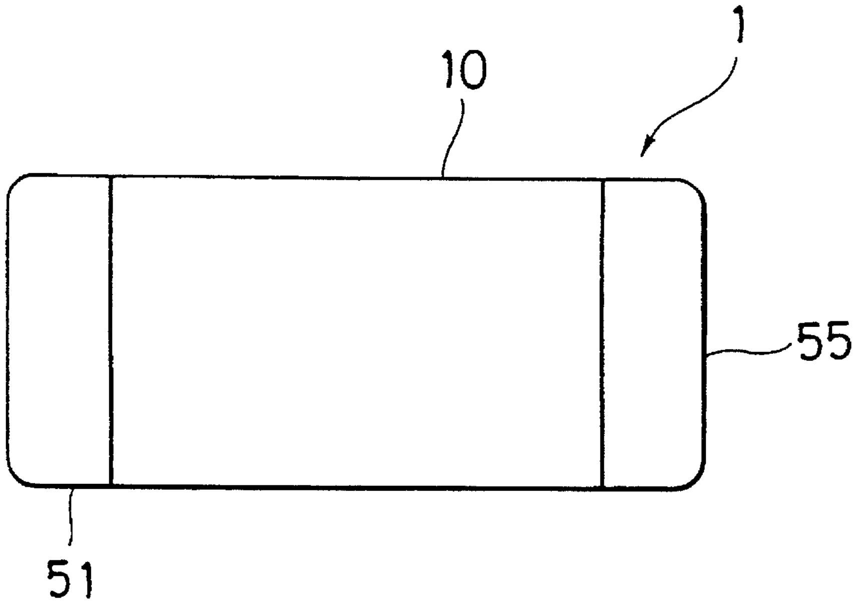
FIG. 1 is a front view of a multilayer inductor according to the present invention.

FIGS. *4a–4e* is a perspective view illustrating successive steps of the method of fabricating the multilayer inductor of FIG. 1.

FIGS. *5a–5b* is a fragmental enlarged plan view illustrating the method of FIG. 4 in more detail.

FIGS. *6a–6c* is an enlarged perspective view illustrating the method of FIG. 4 in more detail.

Figure 7:
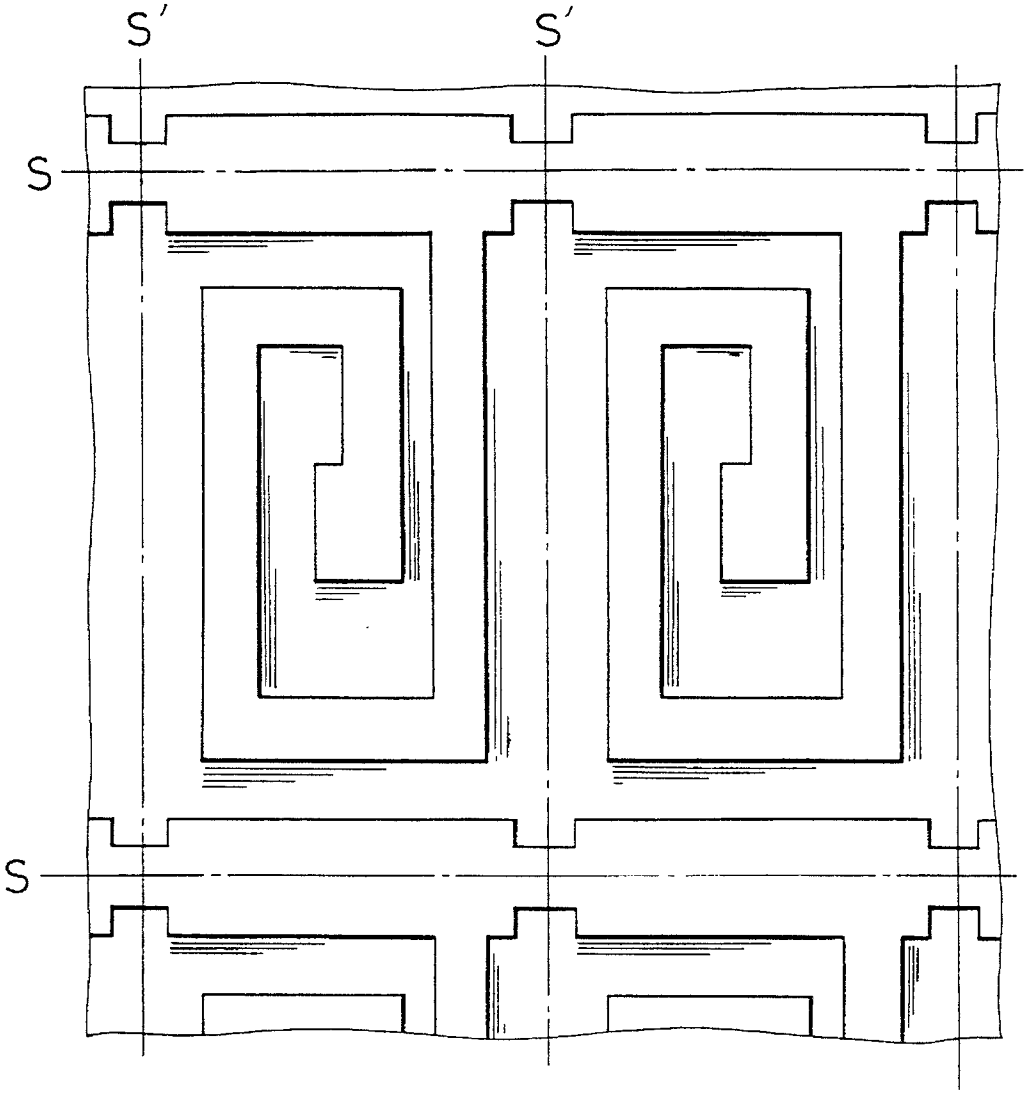

FIG. 7 illustrates another exemplary conductor pattern which forms dummy conductor patterns when the laminate is cut into chips along lines S and S'.

ILLUSTRATIVE CONSTRUCTION

Figure 2:
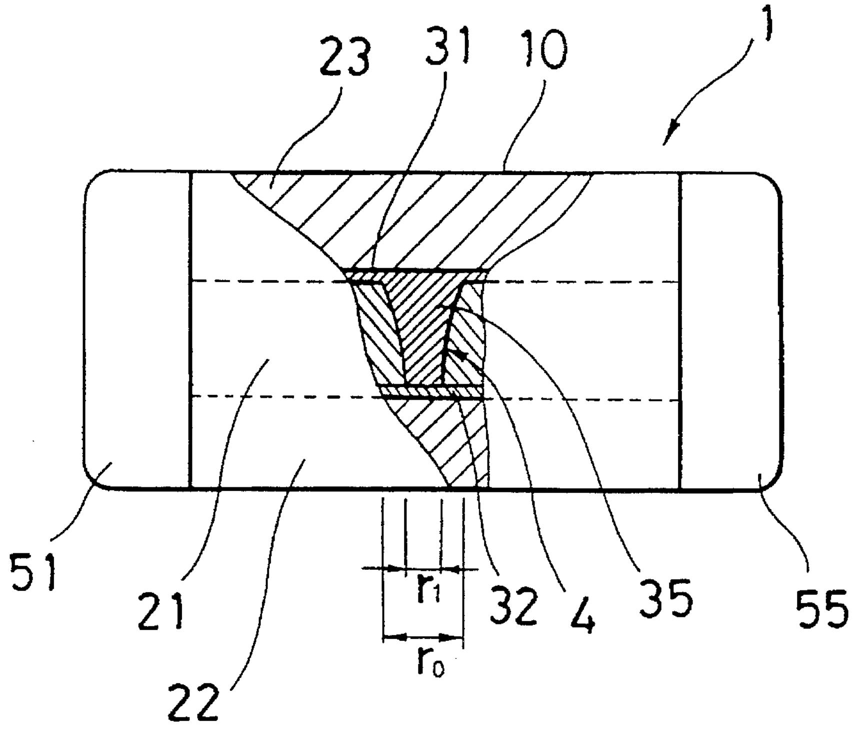
FIG. 2 is a partially cut-away front view showing the internal structure.
Figure 3:
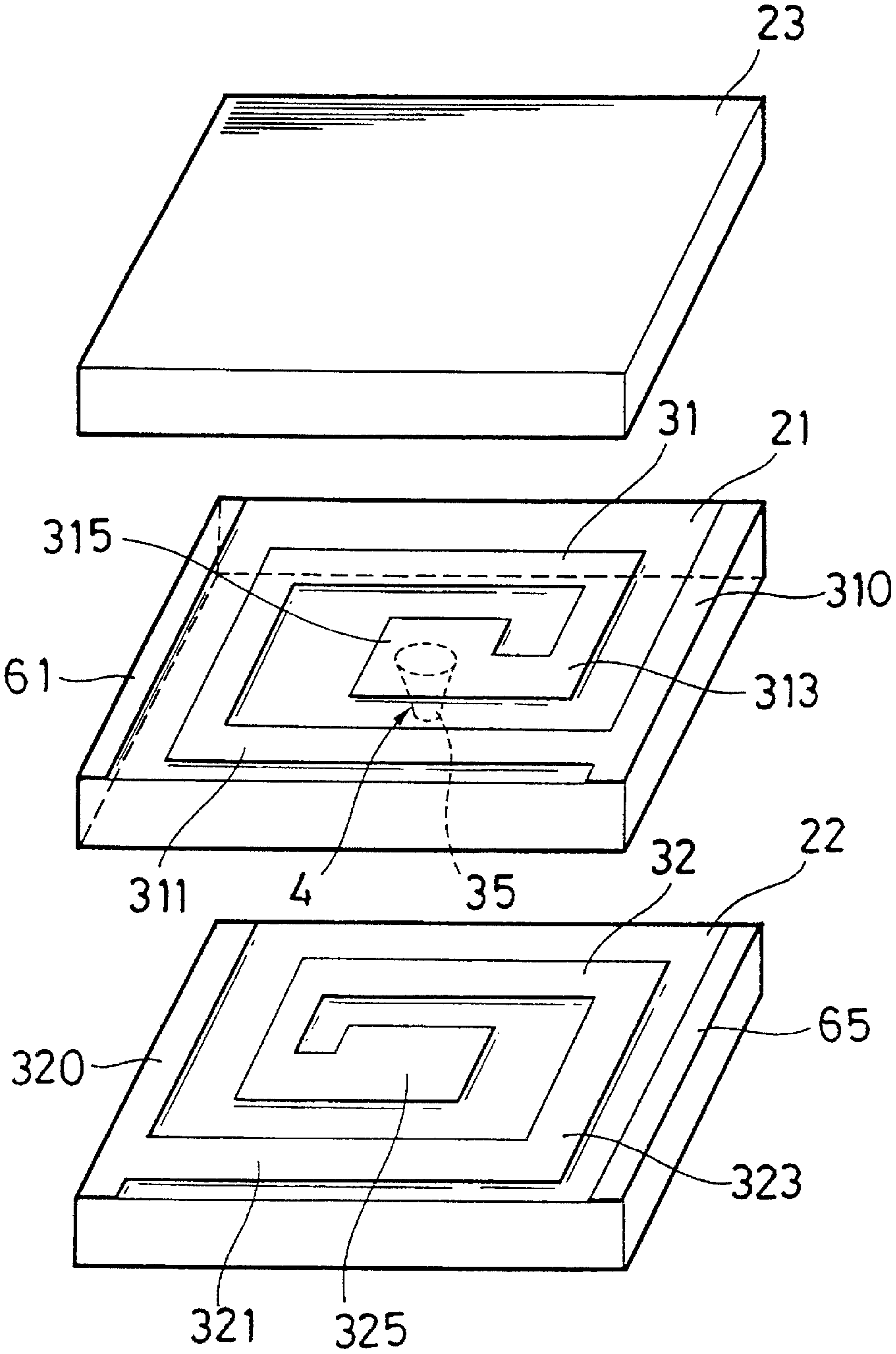
FIG. 3 is a perspective view of the inductor of FIG. 1 in disassembled state.
Figure 4A:
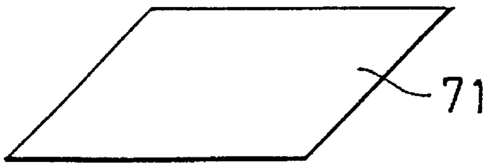
Figure 4B:
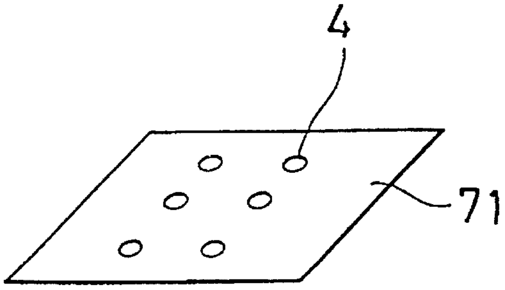
Figure 4C:
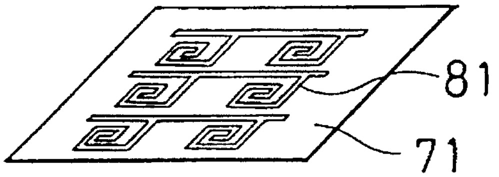
Figure 4D:
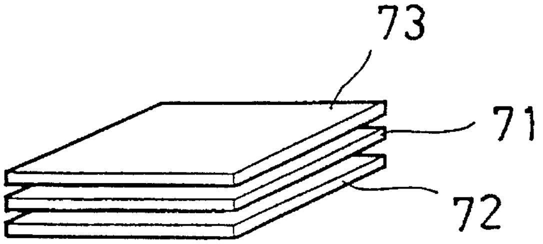
Figure 4E:
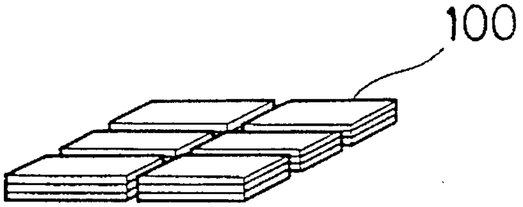

The construction of the present invention is now described in detail. Referring to FIGS. 1, 2 and 3, there is illustrated a preferred embodiment of the multilayer inductor according to the present invention. FIG. 1 is an elevational view of the multilayer inductor, FIG. 2 is a partially cut-away elevational view of FIG. 1 showing the internal structure, and FIG. 3 is a disassembled perspective view of FIG. 1.

The multilayer inductor 1 includes a chip body 10 comprising first, second and third magnetic material sheets 21, 22 and 23 of substantially equal thickness which are integrally stacked one on another. That is, the present invention is embodied as a three-layer structure including a first magnetic material sheet 21 sandwiched on its opposed major surfaces between second and third magnetic material sheets 22 and 23. The structure of three layers of substantially equal thickness reduces the number of steps, significantly facilitates the manufacturing process and increases large-scale productivity because it is only necessary to furnish magnetic material sheets of the same type and to print only two magnetic material sheets 21 and 22. Moreover, the thickness of each layer, especially the first magnetic material sheet 21 between conductor patterns 31 and 32 can be sufficiently increased to reduce floating capacity and improve high-frequency response.

The chip body 10 may have a thickness of 0.5 to 2 mm, especially 0.6 to 1.5 mm. Its plan size is generally about 1.3 to 4.8 mm × about 0.5 to 3.5 mm, especially about 1.7 to 3.5 mm × about 0.9 to 2.8 mm.

Then the first magnetic material sheet 21 in the chip 10 may have a thickness of at least 0.2 mm. A thickness below this limit would lead to a loss of high-frequency response. It is to be noted that the first magnetic material sheet 21 generally has a thickness of 0.2 to 0.8 mm, especially 0.3 to 0.5 mm.

The thickness of the second and third magnetic material sheets 22 and 23 also contributes to an improvement in high-frequency response. For better high-frequency response, each of these sheets should preferably have a thickness of at least 0.2 mm. It is preferred for large scale production that all the three layers have an equal thickness of 0.2 to 0.8 mm.

In the illustrated embodiment, the first and second magnetic material sheets 21 and 22 are provided with first and second conductor patterns 31 and 32 on the major surfaces thereof facing the magnetic material sheet 23, respectively. In order to achieve a high impedance with a smaller number of layers, for example, two sheets in the embodiment, the number of coil turns on each surface should be increased. Since it lowers large-scale productivity and manufacturing yield to form coil patterns on the both surfaces of a sheet with through-holes extending therebetween as previously described, the pattern should be formed only on one major surface of a sheet and shaped spiral.

In the illustrated embodiment, the conductor patterns 31 and 32 on the first and second magnetic material sheets 21 and 22 are strip-shaped patterns which have extreme lead-out portions 310 and 320 of strip shape each extending over the entire length of one edge of the major surface, extend from the inside of the extreme lead-out portions toward the center of the major surface in a spiral manner while making perpendicular turns, and reach pattern ends 315 and 325 at the center of the major surface. The ends 315 and 325 of the first and second conductor patterns 31 and 32 are electrically connected by a conductor 35 which is filled in a through-hole 4 in the first magnetic material sheet 21.

The entire pattern starts from the extreme lead-out portion 310 of the first conductor pattern 31, makes four turns on the first magnetic material sheet 21 each turn at an angle of 90°, then makes further four turns on the second magnetic material sheet 22, eight turns in total, and reaches the extreme lead-out portion 320 of the second conductor pattern 32 which is parallel to the starting extreme lead-out portion. It is defined that a pattern section extending from a first linear strip 311 starting from the extreme lead-out portion 310 to a position 313 which is located just before a linear strip which resumes parallel to the first linear strip 311 forms one wind or turn. Then the pattern makes a first turn on the first magnetic material sheet 21, then transfers to the second conductor pattern 32 on the second magnetic material sheet 22, completes a second turn at position 323, extends along the last linear strip 321 which is parallel to the first linear strip 311 of the first conductor pattern 31, and reaches the extreme lead-out portion 320 located along the edge opposed to the extreme lead-out portion 310 of the first conductor pattern 31. That is, this pattern includes two turns and about ¼ of a turn, which is designated 9/4 turns. By the term about ¼ of a turn, it is meant that since one spiral turn generally consists of four linear strips, one of the four linear strips contributes to a winding.

By providing a winding number of at least about 9/4 turns in this way, impedance is improved. It is to be noted that the winding number can be made greater than 9/4 turns if the planar size permits. The chip body of the above-mentioned size generally permits from about 9/4 turns to about 17/4 turns, especially up to about 13/4 turns. It is preferred that the number of turns is approximately equal between the first and second conductor patterns as in the illustrated embodiment. The conductor patterns may have different numbers of turns although both should preferably have at least one turn.

Further, preferably the first and second conductor patterns 31 and 32 of spiral configuration are in substantial vertical registry with each other through the first magnetic material sheet 21. More preferably, when the first conductor pattern 31 is vertically projected on the second conductor pattern 32, there is an overlap of 50% or more between the patterns. This can lead to an impedance improvement.

The first and second conductor patterns 31 and 32 preferably have a width of about 50 to 300 μm and a thickness of about 5 to 50 μm. It is to be noted that the pattern end portions 315 and 325 of the first and second conductor patterns 31 and 32 are configured to include a wide pad having a width of 150 to 400 μm and a length of 150 to 500 μm to ensure their connection to the conductor 35 in the through-hole 4.

Where the magnetic material sheet 21 which is thicker than in the prior art is perforated with the through-hole 4 and the through-hole 4 is filled with the conductor 35 to connect the upper and lower conductor patterns 31 and 32 in this way, there is the risk of uncertain connection and shortage of conductive paste filling which will result in poor conduction and an increase or variation or change with time of DC resistance. In the illustrated embodiment, the through-hole 4 has a diameter $r_0$ on the first conductor pattern 31 bearing side which is larger than a diameter $r_1$ on the rear side. Such tapering allows the through-hole 4 to be effectively filled with conductive paste simply by printing the paste while effecting suction from the rear side of the first magnetic material sheet 21. This leads to improved large-scale production, improved product yield, reduced performance variation, and reduced change with time.

In this embodiment, $r_1$ is generally about 50 to 200 μm and $r_0/r_1$ preferably ranges from about 1.2 to about 1.7. A too smaller diameter $r_1$ would cause a problem in conduction whereas a too larger diameter $r_1$ would cause a problem in filling or adversely affect wiring density. The benefits of reduced diameter $r_1$ would be lost with a too low $r_0/r_1$ ratio whereas extreme diameter tapering would cause a problem in filling or adversely affect wiring density. The diameter tapering from $r_0$ to $r_1$ may be either continuous or stepwise.

The through-hole 4 of such configuration may be obtained by tailoring the shape of a drilling needle, laser drilling the through-hole 4, or drilling a green sheet resting on a support such as polyester film.

Additionally, the surfaces of the first and second magnetic material sheets 21 and 22 on which the first and second conductor patterns 31 and 32 are formed are formed with dummy conductor patterns 61 and 65, respectively. These dummy conductor patterns 61 and 65 are strips which are spaced apart and electrically insulated from the first and second conductor patterns 31 and 32 and located along the edge on the opposite side to the extreme lead-out portions 310 and 320 of the first and second conductor patterns 31 and 32, respectively. As a result, the dummy patterns 61 and 65 are disposed in opposed registry with the extreme lead-out portions 320 and 310 of the conductor patterns 32 and 31 on the magnetic material sheets 22 and 21 which are different from the magnetic material sheets 21 and 22 on which the dummy patterns 61 and 65 themselves are formed.

In a special example in which relatively thick magnetic material sheets having a thickness of at least 0.2 mm after firing are used, a multilayer inductor is fabricated by printing a conductive paste on green sheets, stacking and compression bonding the printed sheets, firing, thereby forming extreme lead-out portions 31 and the like over the entire edge in strip form, applying an external electrode-forming paste to the edge, followed by firing to form external electrodes 51 and 55. Since the contact area with the green sheets is increased to reduce the wettability with the external electrode-forming paste, the connection between the lead-out portions and the external electrode becomes insufficient, leading to the risk of an increase, variation or change with time of DC resistance and even of poor conduction. In the fabrication of multilayer inductors, it is preferred in view of large-scale production, as shown in FIGS. 4*a*–4*e*, to form a plurality of printed patterns 81 of conductive paste corresponding to the conductor patterns 31 on a green sheet 71 having a large area (see FIG. 4(*c*)), stacking and compression bonding a plurality of printed sheets (see FIG. 4(*d*)), and then cutting the laminate into chips (see FIG. 4(*e*)) followed by firing. If the stacking and cutting are done in misalignment, there is increased the possibility of poor conduction as a result of insufficient connection between external electrodes 51, 55 and extreme lead-out portions 310, 320. Misalignment between the patterns resulting from stacking misalignment can also lead to a misalignment between the conductor 35 in the through-hole 4 and the second conductor pattern 32, which also causes a lowering of manufacturing yield and reliability.

Figure 5A:
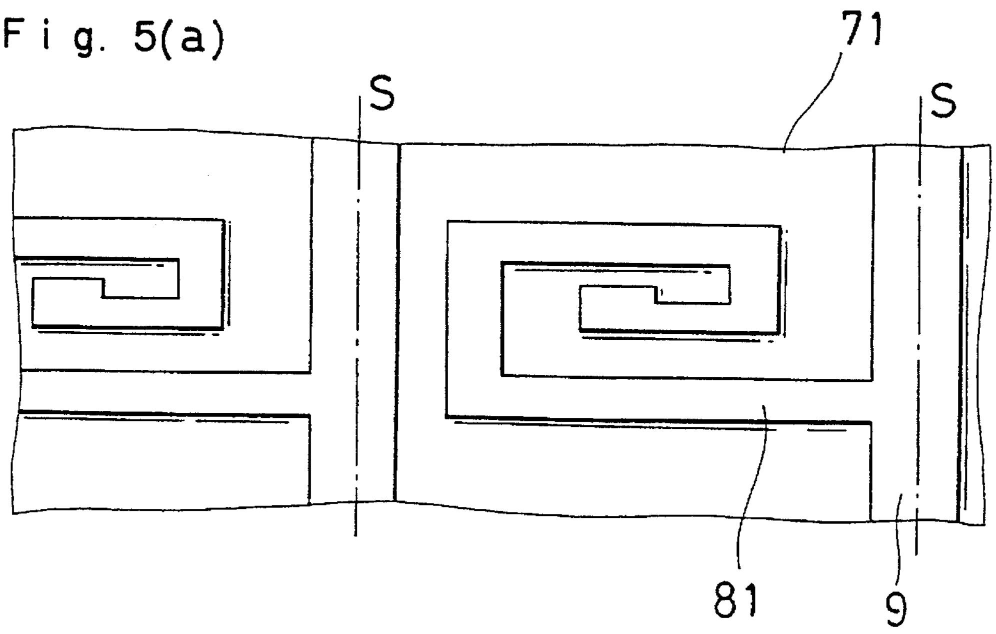
Figure 5B:
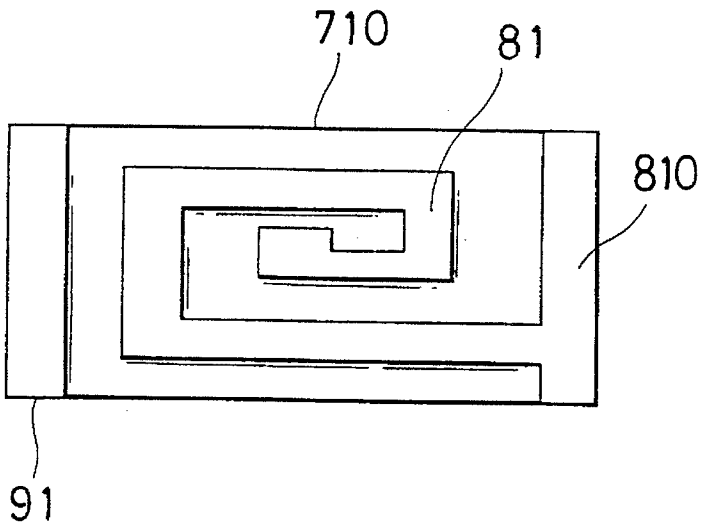

As shown in FIG. 5(*a*), in concurrently printing a plurality of conductor patterns 81 corresponding to conductor patterns on a green sheet 71 having a large area, strip patterns 9 corresponding to the extreme lead-out portions 310, 320 are made wider so that a cut may be made at the intermediate of the pattern 9 along line S to produce chips. Then, as shown in FIG. 5(*b*), a pattern 91 corresponding to the dummy conductor pattern 61, 65 and a pattern 810 corresponding to the extreme lead-out portion 310, 320 are simultaneously formed on opposite edges of the green sheet 710 sectioned into a chip. This ensures connection between the external conductors 51, 55 and the extreme lead-out portions 310, 320. Also, the dummy conductor patterns 61, 65 exposed at the edges improve the wettability of the external electrode-forming paste, resulting in improved manufacturing yield and reliability.

Figure 6A:
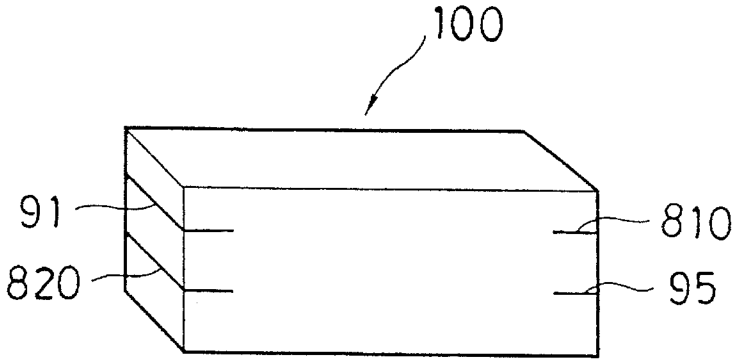
Figure 6B:
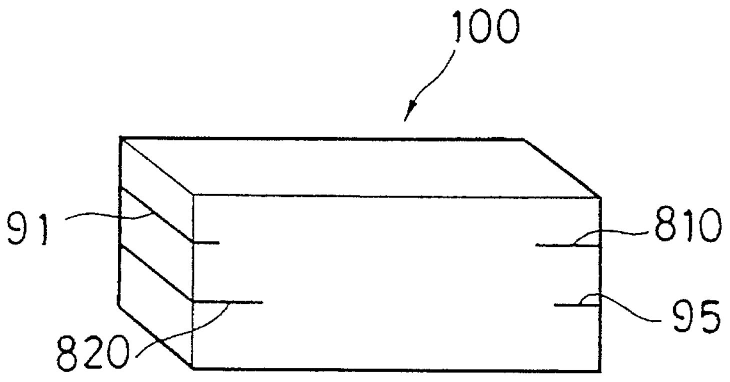
Figure 6C:
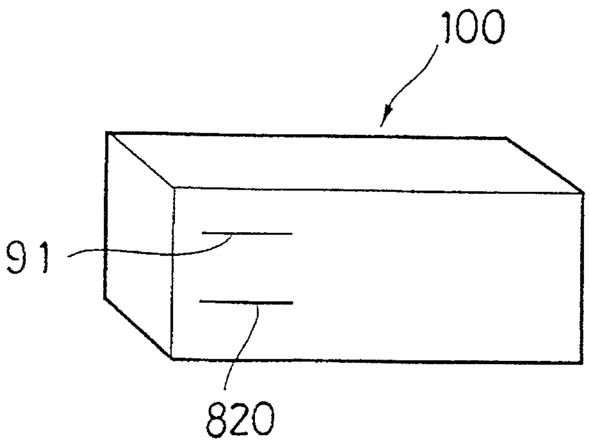

By visually observing patterns 91, 95 corresponding to the dummy conductor patterns 61, 65 which are exposed at the edges after the laminate is cut into chips and patterns 810, 820 corresponding to the extreme lead-out portions 310, 320, it is possible to readily judge whether the stacking and cutting are performed in correct alignment as shown in FIG. 6(*a*) or stacking misalignment as shown in FIG. 6(*b*) or cutting misalignment as shown in FIG. 6(*c*) so that such misalignment can be corrected. This results in improved manufacturing yield and permits visual inspection of conduction anomaly, eliminating a conduction test on each chip after firing, which is very advantageous for large-scale manufacture. FIG. 7 illustrates another exemplary conductor pattern which forms dummy conductor patterns when the laminate is cut into chips along lines S and S'.

Thereafter the chip body 10 is provided with a pair of external electrodes 51 and 55 in electrical connection with the first and second conductor patterns. By covering the three sides where the extreme lead-out portions 340, 320 are exposed with the external electrodes 51, 55, better connection is achieved, and moisture resistance and weathering resistance against the influence of water are improved to provide higher reliability.

The conductors 31, 32, and 35 may be formed of any conventional well-known conductor material. For example, Ag, Cu, Pd and alloys thereof may be used, with Ag and Ag alloys being preferred. Preferred silver alloys are Ag-Pd alloys containing 70% by weight or more of Ag and the like.

The magnetic material sheets 21, 22, and 23 of the multilayer inductor 1 may be formed of any conventional well-known magnetic material sheet material. For example, various spinel soft ferrites having a spinel structure may be used with the use of Ni series ferrites, especially Ni-Cu-Zn ferrites is preferred in connection with firing temperature. Since the Ni-Cu-Zn ferrites are low-firing-temperature materials and good insulators, multilayer inductors using magnetic layers of such ferrite according to the present invention can be advantageously fired at about 900° C. or lower temperatures to achieve excellent properties. Green magnetic material sheets of ferrite material can be co-fired with conductive paste at firing temperatures of 800° to 1000° C., especially 850° to 950° C.

No particular restriction is imposed on the material of which the external electrodes 51 and 55 are formed. various conductor materials such as Ag, Ni, Cu, etc or alloys thereof such as Ag-Pd may be used in the form of a printed film, plated film, evaporated film, ion plated film or sputtered film or a laminate of such films. Among others, a coating of Ag or Ag alloy having a plating of Cu, Ni or Sn stacked thereon is preferred for solder wettability and aging resistance. The external electrodes 51, 55 may have any desired thickness and the thickness is generally about 50 to 200 μm in total although it may be determined depending on the purpose and application.

The multilayer inductors of the present invention may be used in various electronic circuits for noise suppression or other purposes. They well perform at a frequency of about 50 to 1500 MHz, especially 100 to 1000 MHz. The present invention permits the inductors to have an impedance of about 180 to 250 Ω at a frequency of 300 MHz even through the inductors are reduced in size.

Next, the method of fabricating a multilayer inductor according to the present invention is described. First, there are separately furnished green magnetic material sheets, a conductor layer-forming paste, and an external electrode-forming paste. They all may be prepared by conventional techniques.

For example, green magnetic material sheets are prepared by wet milling ferrite raw material powder in a ball mill or the like. The wet milled powder is dried often by means of a spray drier or the like, and then calcined. The powder is again wet milled in a ball mill or the like often until a mean particle size of about 0.5 to 2 μm is reached, and then dried by means of a spray drier or the like. The resulting mix ferrite powder is mixed with a binder such as ethyl cellulose, acrylic resin, polyvinyl butyral and polyvinyl alcohol and a solvent to form a slurry. Various magnetic particles may be used instead of the ferrite powder. Thereafter, green sheets of about 0.2 to 0.8 mm thick were formed in a conventional manner. The conductor paste and the external electrode-forming paste are generally comprised of conductive particles, a binder and a solvent. Such a composition is mixed and milled by means of a three roll mill, for example, to form a paste or slurry.

Next, a green magnetic material sheet 71 having a large surface area is prepared as shown in FIG. 4(*a*). The sheet is perforated with a plurality of through-holes 4 as shown in FIG. 4(*b*). Then a plurality of patterns 81 of the conductor paste are formed to the predetermined configuration as shown in FIG. 4(*c*), obtaining a first green magnetic material sheet 71.

This sheet is then sandwiched between a second green magnetic material sheet 72 which is prepared by the same procedure, but free of a through-hole 4 and a third green magnetic material sheet 73 which is free of a conductor paste pattern as shown in FIG. 4(*d*). The laminate is then cut into chips 100 as shown in FIG. 4(*e*). They are then fired.

The firing conditions and atmosphere may be suitably selected in accordance with the material or the like. In general, the firing temperature is about 850° to 950° C. and the firing time is about 2 to 7 hours. The firing atmosphere may be a non-oxidizing atmosphere if Cu, Ni or the like is used as the conductor layer or air if Ag, Pd or the like is used as the conductor layer.

The thus obtained chip body 10 is polished on the end surfaces by barrel polishing, sand blasting or the like and the external electrode-forming paste is baked thereto to form external electrodes 51, 55. If necessary, terminal electrodes are formed on the external electrodes 51, 55 by plating or the like. There has been described a multilayer inductor of the three layer structure for bead cores wherein the number of layers and the number of turns may be altered as desired.

EXAMPLE

Examples of the present invention are given below by way of illustration.

EXAMPLE 1

A powder mixture of NiO, CuO, ZnO and $Fe_2O_3$ as a ferrite raw material was wet milled in a ball mill, then dried by means of a spray drier, and calcined at 780° C., obtaining granules. The granules were milled in a ball mill and then dried by means of a spray drier, obtaining a powder having a mean particle size of 1.2 μm. The powder was dispersed in and mixed with toluene-ethyl alcohol along with a predetermined amount of polyvinyl butyral to form a slurry of Ni-Cu-Zn ferrite, which was sheeted into green sheets of 0.4 mm thick.

Using the green magnetic material sheets and a Ag-Pd conductor paste, 550 chips were obtained from a single green sheet as shown in FIGS. 4 and 5. The chips were fired, completing multilayer inductors designated sample No. 1 as shown in FIGS. 1 to 3. The firing included a temperature of 920° C., a time of 7 hours and an air atmosphere.

External electrodes were formed by baking Ag-Pd paste to the chip so as to cover the extreme lead-out portions. The multilayer inductor was dimensioned 2.0 mm × 1.25 mm × 0.9 mm. The specifications of the respective components are given below.

1st, 2nd, 3rd magnetic material sheet thickness: 0.4 mm

Conductor pattern width: 180

Conductor pattern thickness: 10

Extreme lead-out portion width: 200

Dummy conductor pattern width: 200

Number of turns: $9/4$

Through-hole: $r_0$=220 μm, $r_1$=150 μm, $r_0/r_1$=1.47

External electrode coverage width: 0.2 mm (distance from the end surface)

These samples were measured for impedance at varying frequency and an average of impedance measurements was calculated. An average impedance in the high-frequency range of 200 to 1000 MHz was also calculated. The results are shown in Table 1.

TABLE 1

| | Impedance (Ω) at | | | | | | | | Average impedance (Ω) |
|---|---|---|---|---|---|---|---|---|---|
| Sample No. | 10 | 30 | 100 | 200 | 400 | 600 | 800 | 1000 MHz | over 200–1000 MHz |
| 1 (Invention) | 34 | 114 | 158 | 205 | 207 | 165 | 132 | 106 | 163 |
| 4 (Invention) | 81 | 296 | 428 | 406 | 213 | 138 | 103 | 82 | 188 |
| 5 (Invention) | 49 | 567 | 699 | 417 | 198 | 128 | 94 | 80 | 183 |

The variation of DC resistance $R_{DC}$ of 550 samples was less than 3.61%. Good weathering resistance was found.

Sample No. 1 increased the $R_{DC}$ variation to above 9.0% when the dummy conductor patterns were omitted. Also, the $R_{DC}$ variation increased above 9.5% when the through-hole diameters were changed to $r_0$=$r_1$=220 μm; $r_0$=220 μm, $r_1$ =120 μm, $r_0/r_1$=183; or $r_1$=$r_0$=120 μm.

TABLE 2

| Dummy conductor pattern | Variation of $R_{DC}$ (%) |
|---|---|
| Formed | 3.61 |
| Omitted | 9.0 |

TABLE 3

| Through-hole | | | Variation |
|---|---|---|---|
| $r_0$ (μm) | $r_1$ (μm) | $r_0/r_1$ | of $R_{DC}$ |
| 220 | 150 | 1.47 | 3.61 |
| 220 | 220 | 1 | 10.9 |
| 220 | 120 | 1.83 | 9.5 |
| 120 | 120 | 1 | 11.3 |

EXAMPLE 2

In accordance with sample No. 1 of Example 1, three-layer inductors of 3.2 mm × 1.6 mm × 0.85 mm designated sample Nos. 4 and 5 were fabricated using green sheets of 0.35 mm thick. The number of turns was $13/4$ turns for No. 4 and $17/4$ turns for No. 5. The results are also shown in Table 1. Both the samples had a $R_{DC}$ variation of less than 2.4% and showed good weathering resistance.

BENEFIT OF THE INVENTION

Property variation is eliminated and fabrication is easy.

We claim:

1. A multilayer inductor comprising:

a plurality of integrally stacked magnetic material sheets, each one of said plurality of integrally stacked magnetic material sheets having a conductor pattern with an extreme lead-out portion and a dummy conductor pattern spaced apart from said conductor pattern and disposed in substantial registry with said extreme lead-out portion formed on an upper surface thereof;

a through-hole formed completely through each one of said plurality of integrally stacked magnetic material sheets except a bottom one of said plurality of integrally stacked magnetic material sheets, said through-hole being formed at a position where said conductor patterns formed on surfaces of each one of said integrally stacked magnetic material sheets are vertically aligned and being filled with a conductive material that contacts said conductor patterns formed on surfaces of each one of said plurality of integrally stacked magnetic material sheets; and external electrodes connected to said extreme lead-out portion of each one of said conductor patterns.

2. A multilayer inductor according to claim 1 wherein said through-hole has a diameter $r_0$ at an upper surface of a top one of said plurality of integrally stacked magnetic material sheets and a diameter of $r_1$ at an upper surface of said bottom one of said plurality of integrally stacked magnetic material sheets, $r_0$ being greater than $r_1$.

3. A multilayer inductor according to claim 2, wherein the ratio $r_0/r_1$ is in the range of 1.2 to 1.7.

4. A multilayer inductor according to claim 1, wherein each of one said plurality of integrally stacked magnetic material sheets has a thickness of at least 0.2 millimeters.

5. A multilayer inductor according to claim 4, comprising exactly three integrally stacked magnetic material sheets of approximately equal thickness, a metal thickness of said multilayer inductor being in the range of 0.5 millimeters to 2 millimeters.

6. A multilayer inductor according to claim 5, wherein each one of said conductive patterns is formed in a rectangular spiral shape and interconnected via said conductive material filling said through-hole so as to form a continuous rectangular spiral of at least 2¼ total turns.

7. A multilayer inductor according to claim 2, further comprising pads located at points of connection between each one of said conductor patterns and said conductive material filling said through-hole, said pads being wider than a pattern width of each one of said conductor patterns.

8. A multilayer inductor comprising: a plurality of integrally stacked magnetic material sheets, each one of said plurality of integrally stacked magnetic material sheets having a conductor pattern with an extreme lead-out portion formed on an upper surface thereof and having a thickness of at least 0.2 millimeters;

a through-hole formed completely through each of said plurality of integrally stacked magnetic material sheets except a bottom one of said plurality of integrally stacked magnetic material sheets, said through-hole being formed at a position where said conductor patterns formed on surfaces of each one of said integrally stacked magnetic material sheets are vertically aligned and being filled with a conductive material that contacts said conductor patterns formed on surfaces of each one of said plurality of integrally stacked magnetic material sheets;

external electrodes connected to said extreme lead-out portion of each one of said conductor patterns; and pads located at points of connection between each one of said conductor patterns and said conductive material filling said through-hole, said pads being wider than a pattern width of each one of said conductor patterns.

9. A multilayer inductor according to claim 8, wherein said through-hole has a diameter $r_0$ at an upper surface of a top one of said plurality of integrally stacked magnetic material sheets and a diameter of $r_1$ at an upper surface of said bottom one of said plurality of integrally stacked magnetic material sheets, $r_0$ being greater than $r_1$.

10. A multilayer inductor according to claim 9, wherein the ratio $r_0/r_1$ is in the range of 1.2 to 1.7.

11. A multilayer,inductor according to claim 8, comprising exactly three integrally stacked magnetic material sheets of approximately equal thickness, a total thickness of said multilayer inductor being in the range of 0.5 millimeters to 2 millimeters.

12. A multilayer inductor according to claim 11, wherein each one of said conductor patterns is formed in a rectangular spiral shape and interconnected via said conductive material filling said through-hole so as to form a continuous rectangular spiral of at least 2¼ total turns.

13. A multilayer inductor according to claim 11, wherein said through-hole is formed through a central area of each of said plurality of integrally stacked magnetic material sheets, and wherein said conductor patterns form a continuous rectangular spiral of at least one turn.

14. A multilayer inductor according to claim 10, wherein said diameter $r_1$ is in the range of 50–200 micrometers, said pads have a width in the range of 150–400 micrometers, and said conductor patterns have a width in the range of 50–300 micrometers.

* * * * *

UNITED STATES PATENT AND TRADEMARK OFFICE

CERTIFICATE OF CORRECTION

PATENT NO. : 5,515,022

DATED : May 7, 1996

INVENTOR(S) : Kouji Tashiro, et. al.

It is certified that error appears in the above-indentified patent and that said Letters Patent is hereby corrected as shown below:

Column 11, line 34, "a metal thickness" should read--a total thickness--.

Column 12, line 30, after "A multilayer", the comma should be deleted--.

Signed and Sealed this

Twenty-fourth Day of September, 1996

*Attest:*

BRUCE LEHMAN

*Attesting Officer* *Commissioner of Patents and Trademarks*